United States Patent
Chan

(10) Patent No.: US 10,833,151 B2
(45) Date of Patent: Nov. 10, 2020

(54) SEMICONDUCTOR STRUCTURE AND OPERATION METHOD THEREOF

(71) Applicant: MACRONIX International Co., Ltd., Hsinchu (TW)

(72) Inventor: Wing-Chor Chan, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 534 days.

(21) Appl. No.: 15/616,690

(22) Filed: Jun. 7, 2017

(65) Prior Publication Data

US 2018/0358354 A1    Dec. 13, 2018

(51) Int. Cl.
| | |
|---|---|
| *H01L 29/00* | (2006.01) |
| *H01L 29/06* | (2006.01) |
| *H01L 29/861* | (2006.01) |
| *H01L 27/02* | (2006.01) |

(52) U.S. Cl.
CPC ...... *H01L 29/0623* (2013.01); *H01L 27/0259* (2013.01); *H01L 29/0692* (2013.01); *H01L 29/861* (2013.01); *H01L 29/0649* (2013.01)

(58) Field of Classification Search
CPC ............ H01L 29/0623; H01L 27/0259; H01L 29/0692; H01L 29/861; H01L 29/0649
See application file for complete search history.

(56) References Cited

U.S. PATENT DOCUMENTS

| | | | | |
|---|---|---|---|---|
| 5,060,037 A | * | 10/1991 | Rountree | ............ H01L 27/0251 257/357 |
| 6,858,902 B1 | * | 2/2005 | Salling | .................. H01L 27/027 257/355 |
| 9,923,051 B1 | * | 3/2018 | Jing | ...................... H01L 21/761 |
| 2003/0042549 A1 | | 3/2003 | Fujihira et al. | |
| 2005/0270710 A1 | | 12/2005 | Ker et al. | |

(Continued)

FOREIGN PATENT DOCUMENTS

| | | |
|---|---|---|
| CN | 1391289 | 1/2003 |
| CN | 102844863 | 12/2012 |

(Continued)

OTHER PUBLICATIONS

CN 105355626 published in Feb. 24, 2016 (Year: 2016).*

(Continued)

*Primary Examiner* — Pete T Lee
(74) *Attorney, Agent, or Firm* — J.C. Patents

(57) ABSTRACT

Provided is a semiconductor structure including a first guard ring and a second guard ring. The first guard ring is located in a substrate. The first guard ring includes first doped regions and second doped regions arranged alternately. The first doped regions and the second doped regions have different conductivity types. The second guard ring is located adjacent to the first guard ring. The second guard ring includes third doped regions and fourth doped regions arranged alternately, and mask layers. Each of the third doped regions corresponds to each of the second doped regions. Each of the fourth doped regions corresponds to each of the first doped regions. The third doped regions and the first doped regions have the same conductivity type and are disposed in a staggered manner. The mask layers are respectively disposed on the substrate between the third doped regions and the fourth doped regions.

6 Claims, 15 Drawing Sheets

(56) References Cited

U.S. PATENT DOCUMENTS

| | | | |
|---|---|---|---|
| 2005/0275032 A1* | 12/2005 | Kodama | ............... H01L 23/585 |
| | | | 257/355 |
| 2009/0140370 A1* | 6/2009 | Jou | ....................... H01L 23/585 |
| | | | 257/487 |
| 2010/0044748 A1 | 2/2010 | Lin et al. | |
| 2010/0109083 A1 | 5/2010 | Kim et al. | |
| 2013/0113036 A1 | 5/2013 | Roger et al. | |
| 2013/0242448 A1* | 9/2013 | Salcedo | ............. H01L 27/0259 |
| | | | 361/111 |
| 2013/0265676 A1 | 10/2013 | Prabhu et al. | |
| 2014/0332919 A1 | 11/2014 | Guan et al. | |
| 2016/0141287 A1 | 5/2016 | He et al. | |

FOREIGN PATENT DOCUMENTS

| | | |
|---|---|---|
| CN | 104037171 | 9/2014 |
| CN | 105304687 | 2/2016 |
| CN | 105355626 | 2/2016 |
| TW | 437050 | 5/2001 |
| TW | 201112391 | 4/2011 |

OTHER PUBLICATIONS

"Office Action of Taiwan Counterpart Application," dated Nov. 21, 2017, p. 1-p. 4, in which the listed references were cited.
"Office Action of China Counterpart Application", dated Dec. 11, 2019, p. 1-p. 5.

* cited by examiner

SEMICONDUCTOR STRUCTURE AND OPERATION METHOD THEREOF

BACKGROUND OF THE INVENTION

Field of the Invention

The invention relates to a semiconductor structure and an operation method thereof, and more particularly, to a semiconductor structure having electrostatic discharge (ESD) protection capability and an operation method thereof.

Description of Related Art

Electrostatic discharge (ESD) is an effect in which an electric charge is moved rapidly and discharged in a short period of time through a discharge path after accumulating on a non-conductor or an ungrounded conductor. Electrostatic discharge causes damage to the circuitry in integrated circuits. For instance, the human body, machines used to package integrated circuits, or instruments for testing integrated circuits are all common charged bodies. When the charged bodies come in contact with a chip, the charged bodies may discharge to the chip. The instantaneous power of the electrostatic discharge may cause damage or failure to the integrated circuit in the chip.

Due to the compatibility with the current CMOS process, extended drain (ED) MOSFET, lateral double-diffused (LD) MOSFET, and reduced surface field (RESURF) are extensively applied in power semiconductor devices. In the field of power semiconductor devices, MOS having low on-state resistance is often used as a switch. However, current only flows through a MOS surface having low on-state resistance such that the ESD discharge path is limited and ESD performance is not readily improved. Moreover, MOS having high break down voltage (BV) also has higher trigger voltage such that the risk of MOS damage is increased. In the field of power semiconductor devices, the two considerations above are a great challenge in the improvement of the performance of ESD protection.

SUMMARY OF THE INVENTION

It is to be understood that both the foregoing general description and the following detailed description are exemplary, and are not intended to limit the scope of the invention.

The invention provides a semiconductor structure having electrostatic discharge protection capability and an operation method thereof that can improve the performance of electrostatic discharge protection in a given chip area.

The invention provides a semiconductor structure including a first guard ring and a second guard ring. The first guard ring is located in a substrate. The first guard ring includes a plurality of first doped regions and a plurality of second doped regions arranged alternately. The first doped regions and the second doped regions have different conductivity types. The second guard ring is located adjacent to the first guard ring. The second guard ring includes a plurality of third doped regions and a plurality of fourth doped regions arranged alternately, and a plurality of mask layers. Each of the third doped regions corresponds to each of the second doped regions. Each of the fourth doped regions corresponds to each of the first doped regions. The third doped regions and the first doped regions have the same conductivity type and are disposed in a staggered manner. The mask layers are respectively disposed on the substrate between the third doped regions and the fourth doped regions.

The invention provides an operation method of a semiconductor structure including the following steps. One end of an electrostatic discharge protection device is coupled to a bonding pad via a semiconductor device, and another end of the electrostatic discharge protection device is coupled to a ground terminal. The electrostatic discharge protection device includes a first guard ring, a second guard ring, and a third guard ring connected in parallel to one another. When a static signal occurs in the bonding pad, the static signal is conducted to the ground terminal via the first guard ring, the second guard ring, and the third guard ring.

Based on the above, in the invention, the electrostatic discharge protection device is formed by the first guard ring, the second guard ring, and the third guard ring connected in parallel to one another. The electrostatic discharge protection device is coupled between the bonding pad and the ground terminal, and the semiconductor device is coupled to the second guard ring. Accordingly, when a static signal occurs in the bonding pad, the static signal can be conducted to the ground terminal via the first, the second, and the third guard rings to prevent damage to the semiconductor device (i.e., internal circuit). Therefore, the semiconductor structure of the invention can improve the performance of electrostatic discharge protection without increasing chip area. Moreover, in the invention, the N conductivity type doped regions and the P conductivity type doped regions are arranged alternately to form more p/n junctions for increasing the second breakdown current of the semiconductor structure of the invention.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
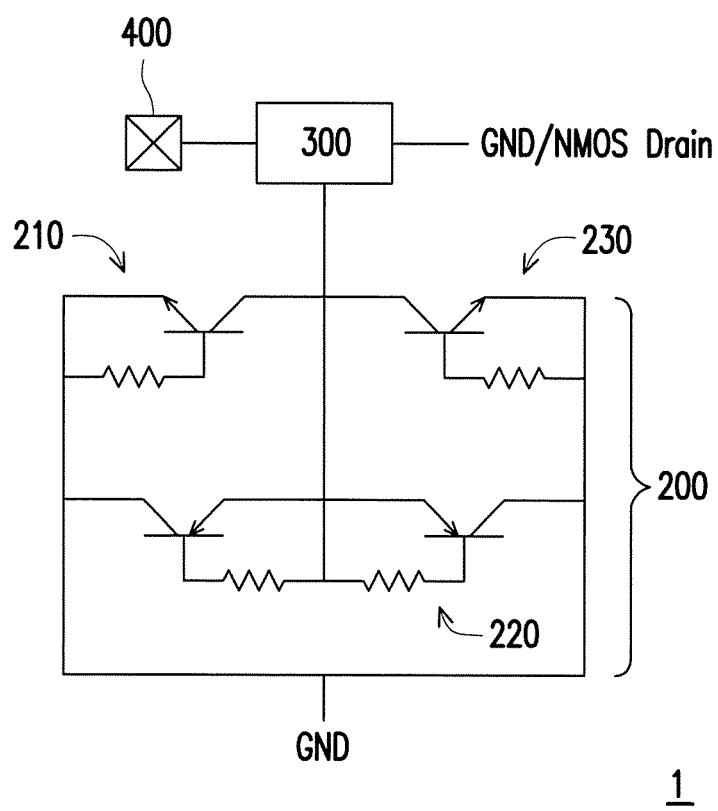
FIG. 1 is an equivalent circuit diagram of a semiconductor structure according to an embodiment of the invention.

The invention is more comprehensively described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1 is an equivalent circuit diagram of a semiconductor structure according to an embodiment of the invention.

Referring to FIG. 1, the present embodiment provides a semiconductor structure 1 including an electrostatic discharge protection device 200 and a semiconductor device 300. The electrostatic discharge protection device 200 is disposed between the semiconductor device 300 and a ground terminal GND. Specifically, the electrostatic discharge protection device 200 includes a first guard ring 210, a second guard ring 220, and a third guard ring 230 connected in parallel to one another, wherein the second guard ring 220 is disposed between the first guard ring 210 and the third guard ring 230. One end of the electrostatic discharge protection device 200 is electrically connected to a bonding pad 400 via the semiconductor device 300; and another end of the electrostatic discharge protection device 200 is electrically connected to the ground terminal GND. In particular, a drain of the semiconductor device 300 is coupled to the protection device 200; a source of the semiconductor device 300 is coupled to another ground terminal GND or a drain of other transistor (e.g. NMOS transistor).

In the present embodiment, the electrostatic discharge protection device 200 can prevent damage to the semiconductor device 300 from the static signal of the bonding pad 400 without affecting the normal operation of the semiconductor device 300 (i.e., internal circuit). For instance, when occurring an electrostatic discharge, the static signal from the bonding pad 400 makes the first guard ring 210, the second guard ring 220, and the third guard ring 230 conduct to the ground terminal GND. Moreover, when a signal is supplied to the bonding pad 400, the semiconductor device 300 operates normally.

In the following, semiconductor structures according to different embodiments are described. Basically, the arrangements of the electrostatic discharge protection device, semiconductor device, and bonding pad of the semiconductor structure of different embodiments are similar to those of FIG. 1, and the difference of the following embodiments is: the arrangements of the guard rings of the electrostatic discharge protection device are different.

FIG. 2 to FIG. 5 are respectively top views of semiconductor structures shown according to the first to fourth embodiments of the invention.

Figure 2:
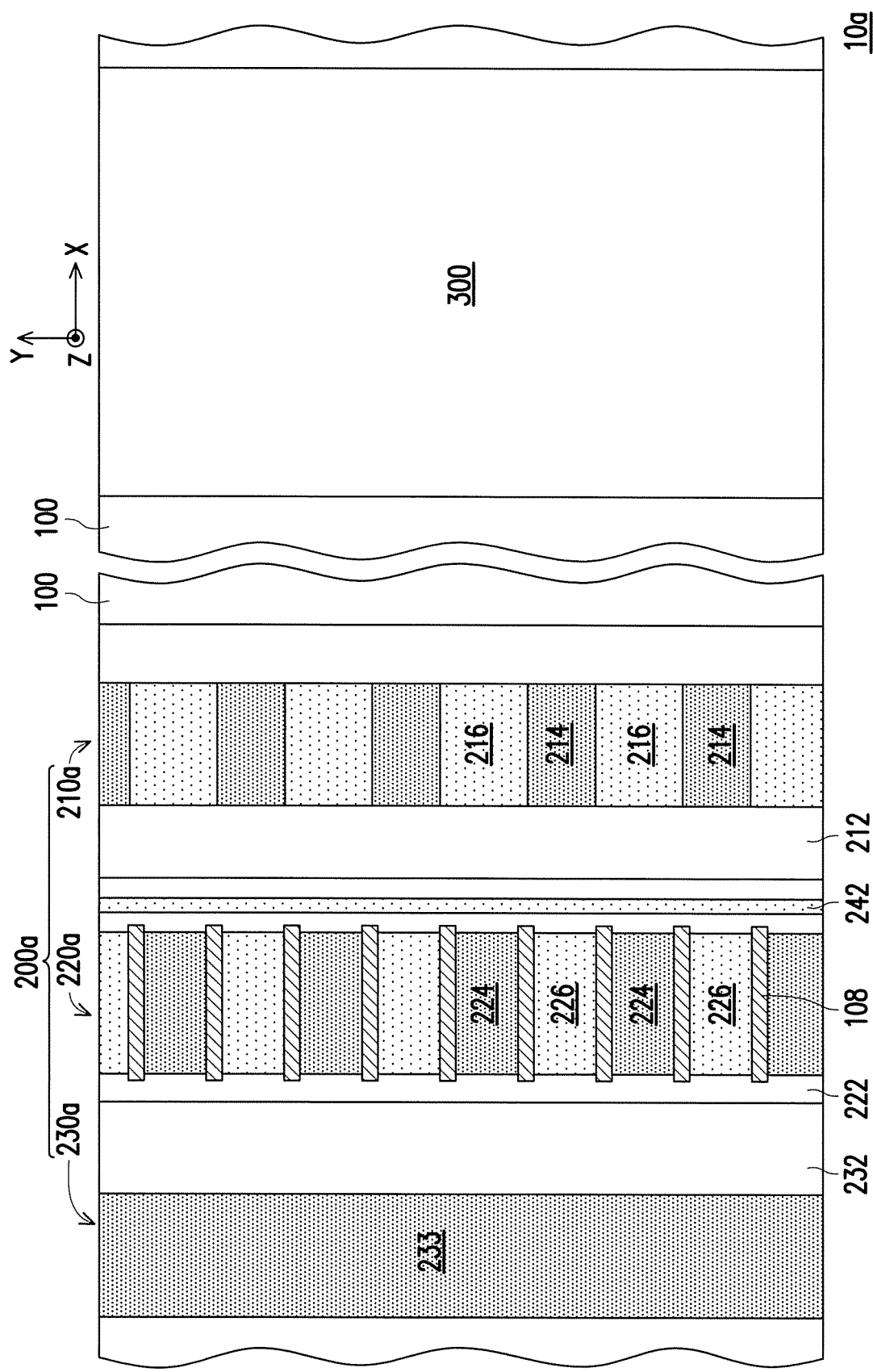
FIG. 2 to FIG. 5 are respectively top views of semiconductor structures shown according to the first to fourth embodiments of the invention.

Referring to FIG. 2, a semiconductor structure 10a of the first embodiment includes a substrate 100, an electrostatic discharge protection device 200a, and a semiconductor device 300. The electrostatic discharge protection device 200a and the semiconductor device 300 are located on the substrate 100. The electrostatic discharge protection device 200a is located adjacent to the semiconductor device 300. Specifically, the electrostatic discharge protection device 200a includes a first guard ring 210a, a second guard ring 220a, and a third guard ring 230a. The second guard ring 220a is located between the first guard ring 210a and the third guard ring 230a. Although the electrostatic discharge protection device 200a shown in FIG. 2 is only located at one side of the semiconductor device 300, the invention is not limited thereto. In another embodiment, the electrostatic discharge protection device 200a can also be located at two sides of the semiconductor device 300 or surrounded entire of the semiconductor device 300.

The first guard ring 210a includes a first well region 212 having a P conductivity type, a plurality of first doped regions 214 having the P conductivity type, and a plurality of second doped regions 216 having an N conductivity type. The first doped regions 214 and the second doped regions 216 are both located in the first well region 212. The first doped regions 214 and the second doped regions 216 are arranged alternately along a Y direction.

The second guard ring 220a includes a second well region 222 having the N conductivity type, a plurality of third doped regions 224 having the P conductivity type, a plurality of fourth doped regions 226 having the N conductivity type, and first mask layers 108. The third doped regions 224 and the fourth doped regions 226 are both located in the second well region 222. The third doped regions 224 and the fourth doped regions 226 are arranged alternately along the Y direction. It should be mentioned that, the third doped regions 224 correspond to the second doped regions 216, and the fourth doped regions 226 correspond to the first doped regions 214. In other words, the orthographic projection of the third doped regions 224 in the YZ plane and the orthographic projection of the second doped regions 216 in the YZ plane are overlapped, and the orthographic projection of the fourth doped regions 226 in the YZ plane and the orthographic projection of the first doped regions 214 in the YZ plane are overlapped. From another perspective, the third doped regions 224 and the first doped regions 214 are disposed in a staggered manner and form a zig-zag arrangement. Similarly, the fourth doped regions 226 and the second doped regions 216 are also disposed in a staggered manner and form a zig-zag arrangement. Moreover, the first mask layers 108 are respectively disposed on the substrate 100 between the third doped regions 224 and the fourth doped regions 226. The first mask layers 108 can be used as a mask for a doping process such that the third doped regions 224 and the fourth doped regions 226 are precisely aligned and formed on a predetermined location and the ESD performance of the semiconductor structure 10a of the present embodiment is improved as a result.

The third guard ring 230a includes a third well region 232 having the P conductivity type and a fifth doped region 233 having the P conductivity type. The fifth doped region 233 is located in the third well region 232 and extended along the Y direction. In other words, the orthographic projection of the fifth doped region 233 in the YZ plane and the orthographic projection of the third doped regions 224 and the fourth doped regions 226 in the YZ plane are overlapped.

Moreover, the semiconductor structure 10a of the first embodiment further includes a seventh doped region 242 having the N conductivity type located between the first guard ring 210a and the second guard ring 220a. Specifically, the seventh doped region 242 is located in the second well region 222 and extended along the Y direction. In an embodiment, the seventh doped region 242 is electrically floating.

In the present embodiment, the semiconductor device 300 can be, for instance, an internal circuit to be protected to prevent damage caused by electrostatic discharge. For instance, the semiconductor device 300 includes extended drain (ED) MOSFET, laterally diffused (LD) MOSFET, lightly-doped drain (LDD) MOSFET, double diffusion drain (DDD) MOSFET, or a combination thereof.

Figure 3:
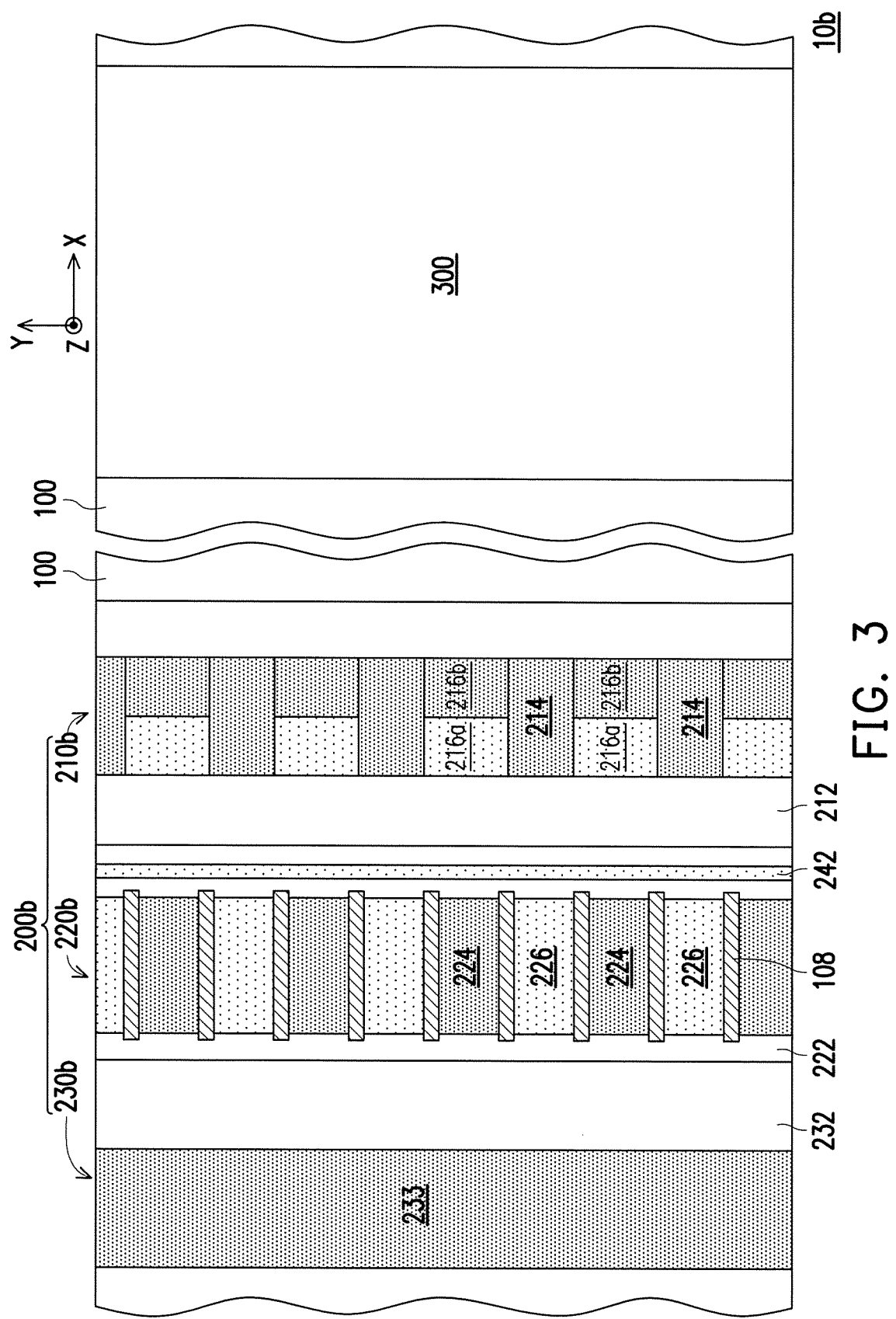

Referring to FIG. 3, basically, a semiconductor structure 10b of the second embodiment is similar to the semiconductor structure 10a of the first embodiment. The difference between the two is: a first guard ring 210a of the second embodiment includes two sub-second doped regions 216a and 216b. The two sub-second doped regions 216a and 216b have different conductivity types. In other words, the sub-second doped region 216a adjacent to the third doped regions 224 has the N conductivity type, and the sub-second doped region 216b away from the third doped regions 224 has the P conductivity type.

Figure 4:
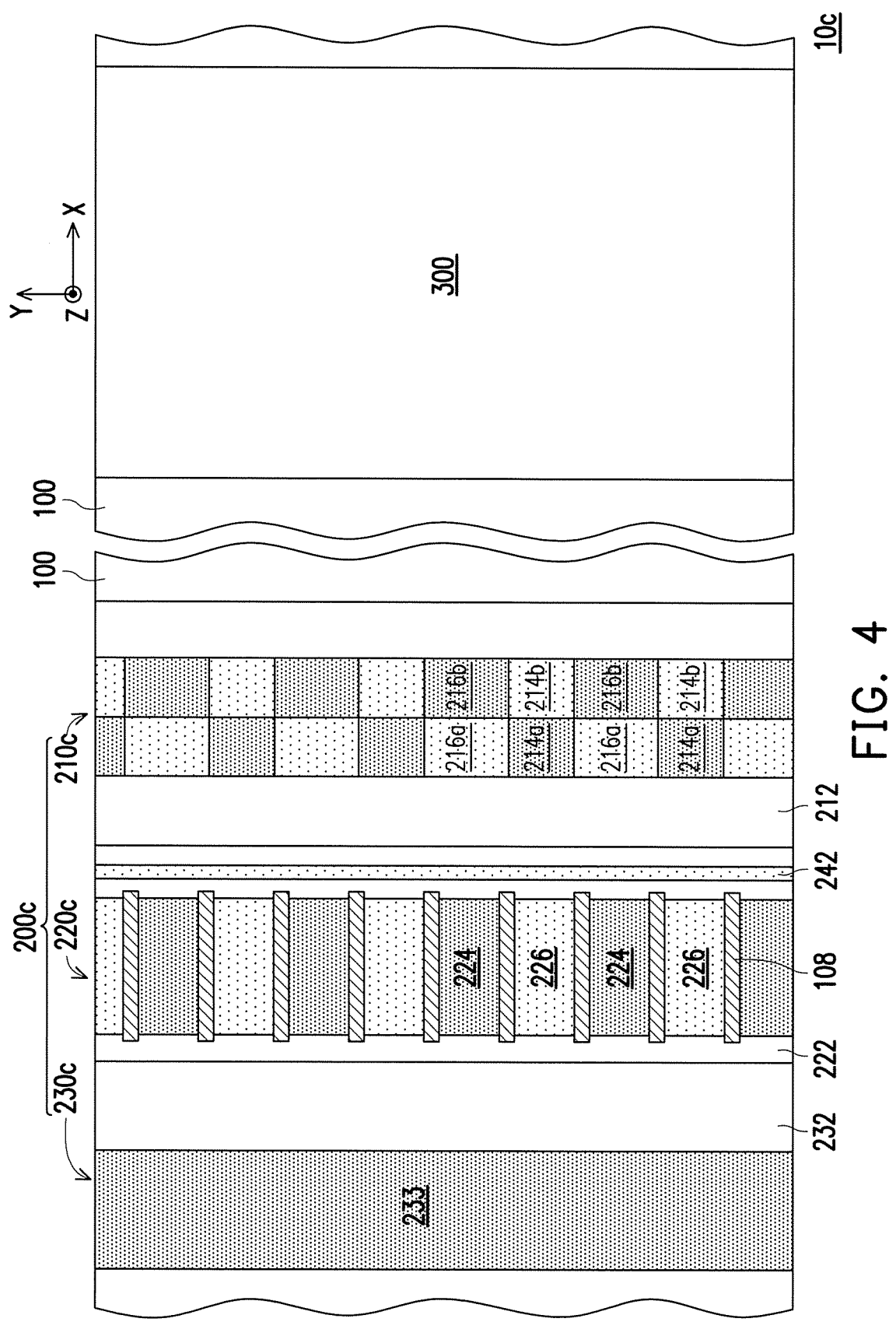

Referring to FIG. 4, basically, a semiconductor structure 10c of the third embodiment is similar to the semiconductor structure 10b of the second embodiment. The difference between the two is: a first guard ring 210c of the third embodiment includes two sub-first doped regions 214a and 214b. The two sub-first doped regions 214a and 214b have different conductivity types. In other words, the sub-first doped region 214a adjacent to the fourth doped regions 226 has the P conductivity type, and the sub-first doped region 214b away from the fourth doped regions 226 has the N conductivity type.

Figure 5:
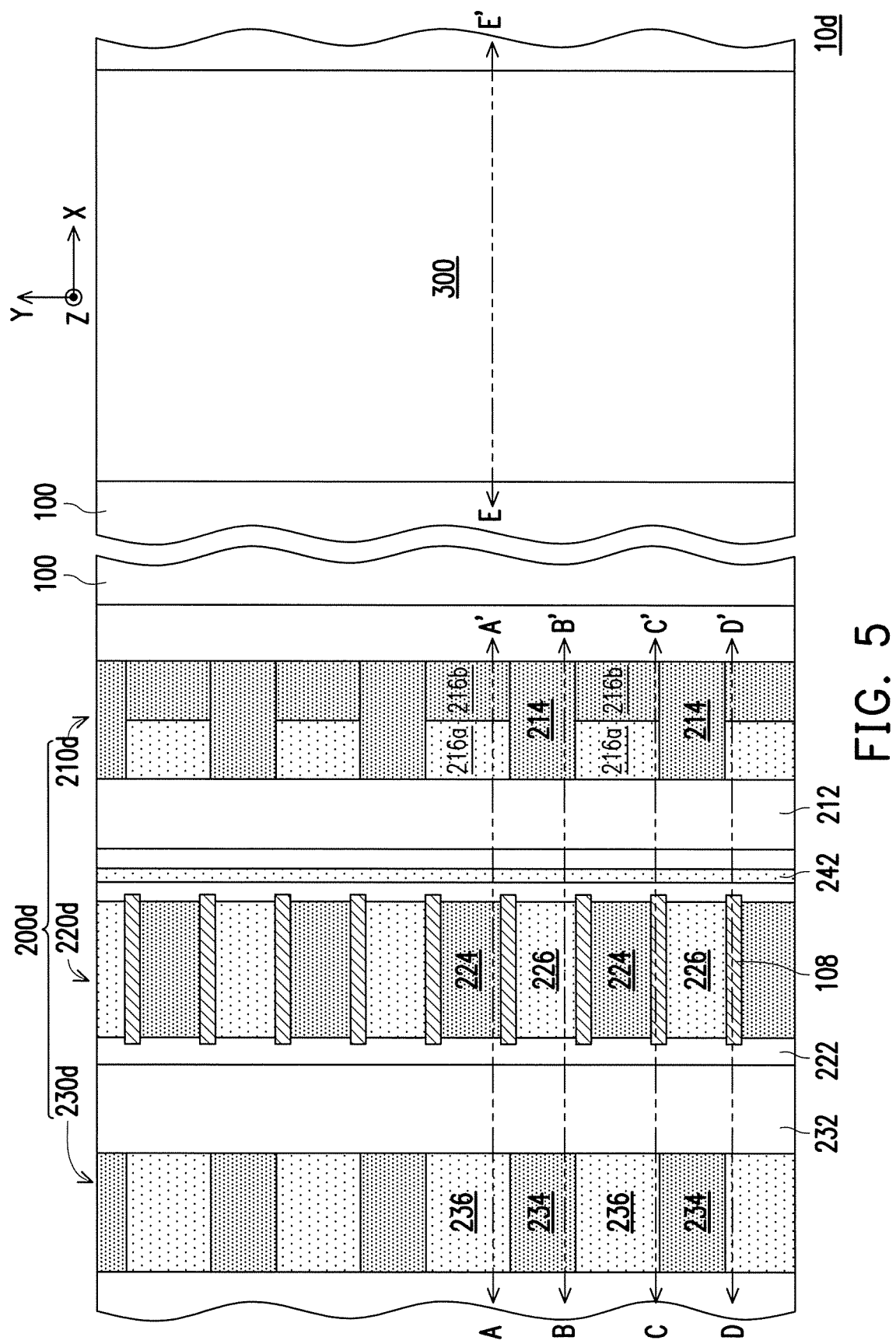

Referring to FIG. 5, basically, a semiconductor structure 10d of the fourth embodiment is similar to the semiconductor structure 10b of the second embodiment. The difference between the two is: a third guard ring 230d of the fourth embodiment includes a plurality of fifth doped regions 234 having the P conductivity type and a plurality of sixth doped regions 236 having the N conductivity type. The fifth doped regions 234 and the sixth doped regions 236 are arranged alternately along the Y direction. The fifth doped regions 234 correspond to the fourth doped regions 226, and the sixth doped regions 236 correspond to the third doped regions 224. In other words, the orthographic projection of the fifth doped regions 234 in the YZ plane and the orthographic projection of the fourth doped regions 226 in the YZ plane are overlapped, and the orthographic projection of the sixth doped regions 236 in the YZ plane and the orthographic projection of the third doped regions 224 in the YZ plane are overlapped. From another perspective, the fifth doped regions 234 and the third doped regions 224 are disposed in a staggered manner and form a zig-zag arrangement. Similarly, the sixth doped regions 236 and the fourth doped regions 226 are also disposed in a staggered manner and form a zig-zag arrangement.

Figure 6:
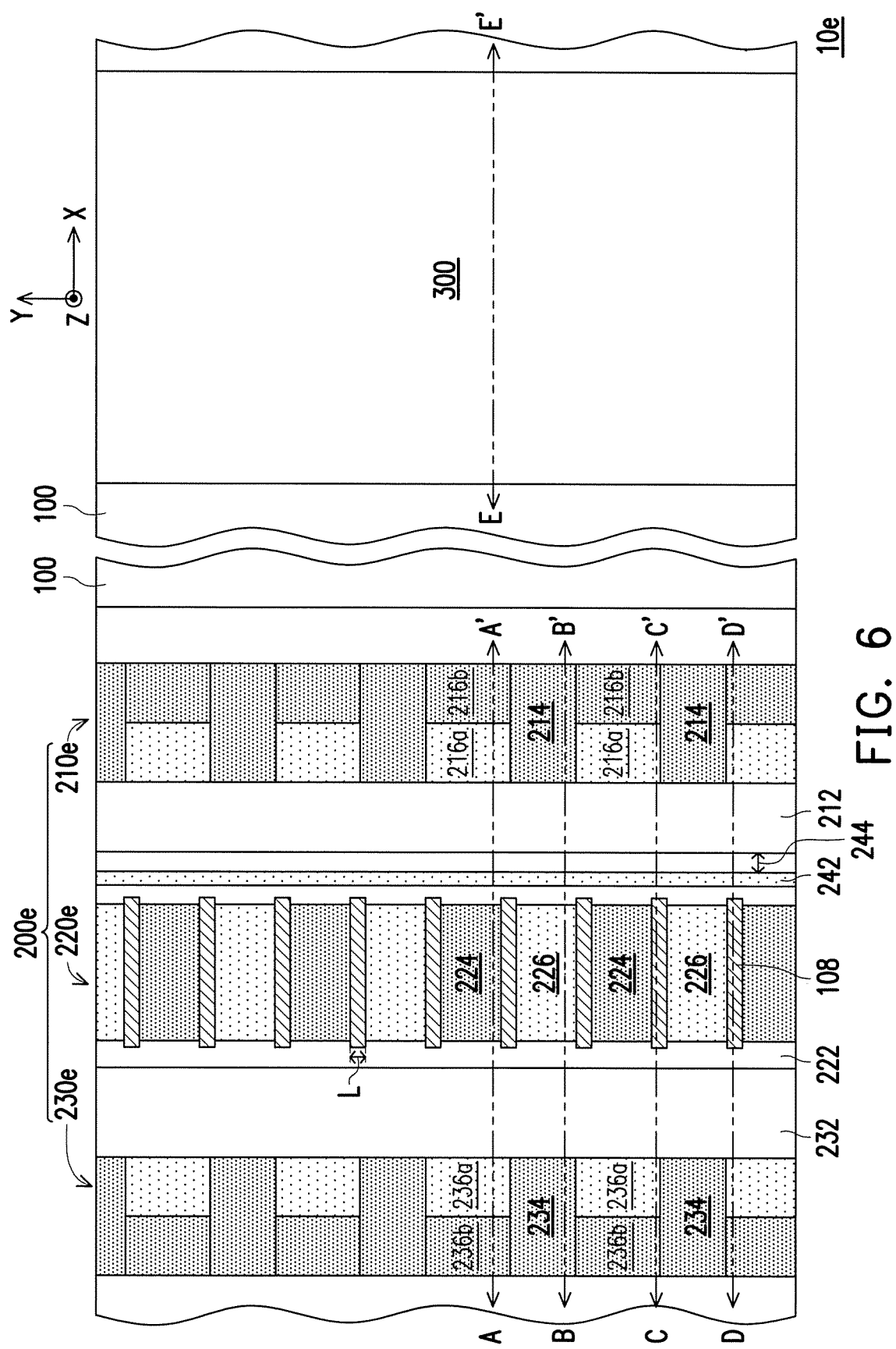
FIG. 6 is a top view of the semiconductor structure shown according to the fifth embodiment of the invention.

FIG. 6 is a top view of the semiconductor structure shown according to the fifth embodiment of the invention. FIG. 7A to FIG. 7E are respectively cross-sectional diagrams of the semiconductor structure of FIG. 6 at lines A-A', B-B', C-C', D-D', and E-E'.

Referring to FIG. 6 and FIG. 7A to FIG. 7E, when viewed from the top, a semiconductor structure 10e of the fifth embodiment is similar to the semiconductor structure 10d of the fourth embodiment. The difference between the two is: a third guard ring 230e of the fifth embodiment includes two sub-sixth doped regions 236a and 236b. The two sub-sixth doped regions 236a and 236b have different conductivity types. In other words, the sub-second doped region 236a adjacent to the third doped regions 224 has the N conductivity type, and the sub-second doped region 236b away from the third doped regions 224 has the P conductivity type.

Figure 7A:
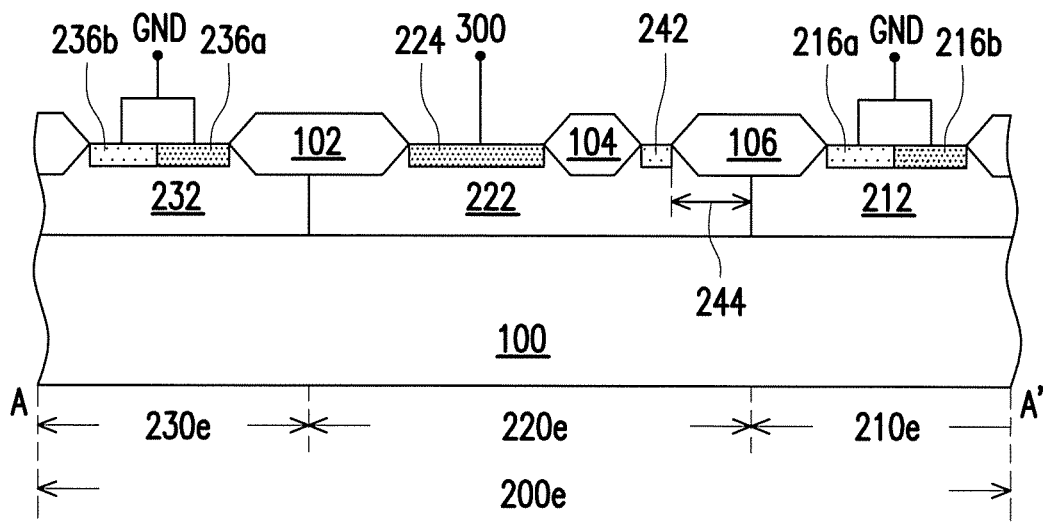
FIG. 7A to FIG. 7E are respectively cross-sectional diagrams of the semiconductor structure of FIG. 6 at lines A-A', B-B', C-C', D-D', and E-E'.
Figure 7B:
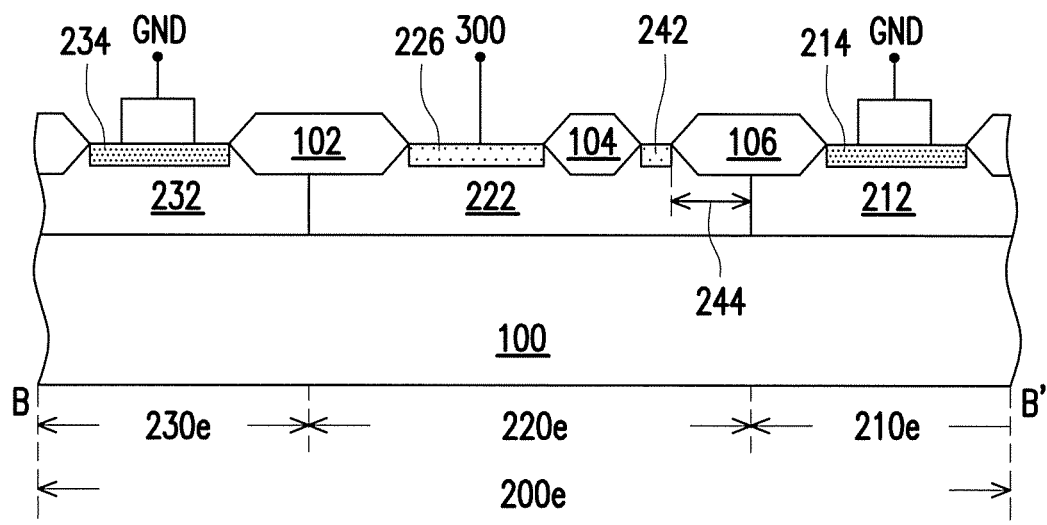

With reference to the cross-sectional diagram, in a first guard ring 210e, the first doped regions 214 and the sub-second doped regions 216a and 216b are all located in the first well region 212. As shown in FIG. 7A and FIG. 7B, the first doped regions 214 and the sub-second doped regions 216a and 216b are all electrically connected to the ground terminal GND. In an embodiment, the doping concentration of the first doped regions 214 and the doping concentration of the sub-second doped regions 216a and 216b can be greater than the doping concentration of the first well region 212.

Figure 7C:
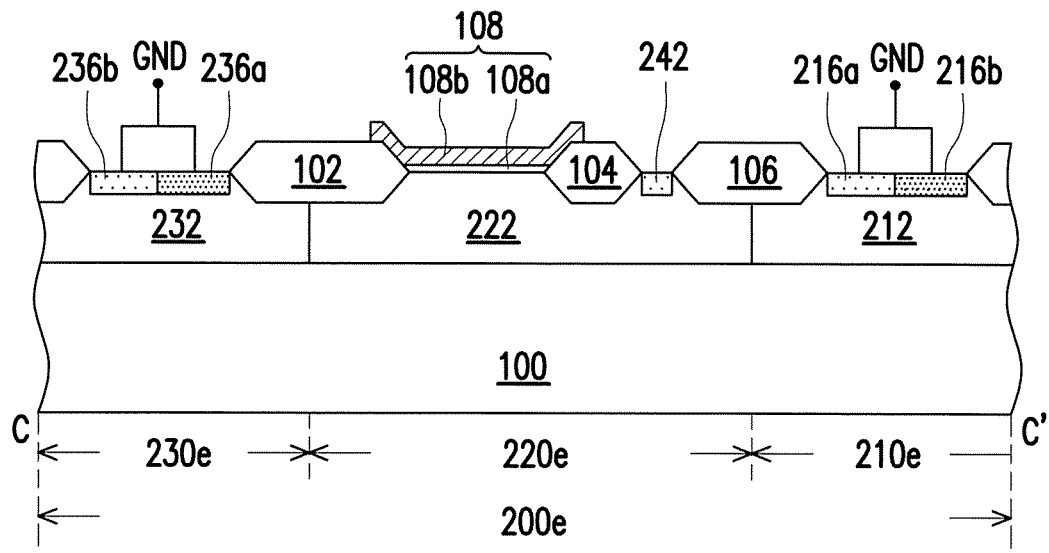
Figure 7D:
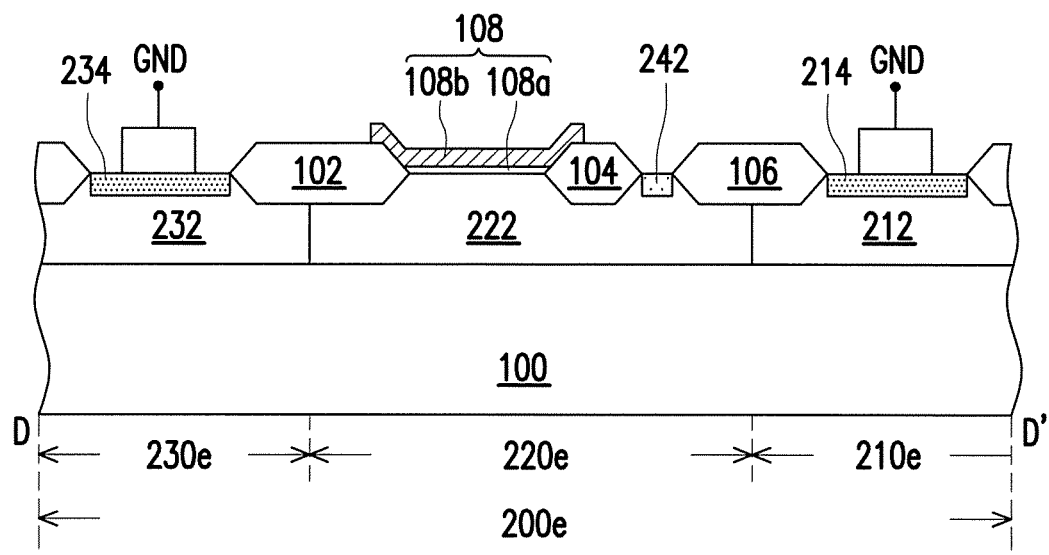
Figure 7E:
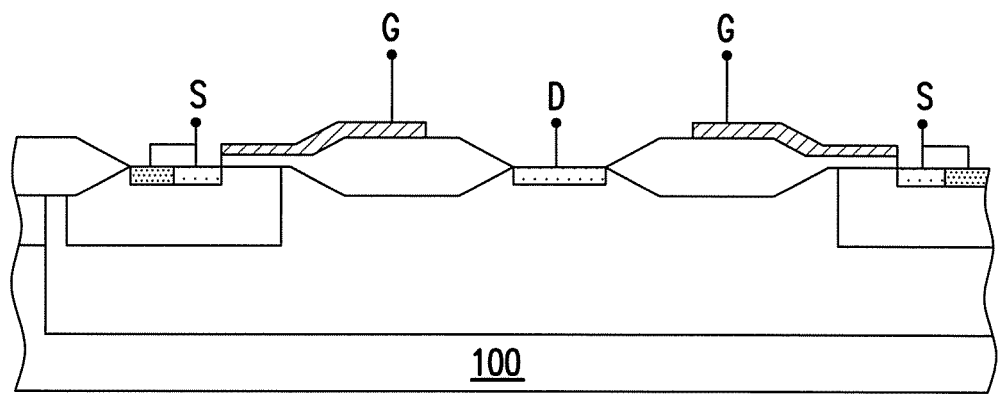

In the second guard ring 220e, the third doped regions 224 and the fourth doped regions 226 are both located in the second well region 222. As shown in FIG. 7A and FIG. 7B, the third doped regions 224 and the fourth doped regions 226 are both electrically connected to the semiconductor device 300. Specifically, the third doped regions 224 and the fourth doped regions 226 are both electrically connected to a drain D of the semiconductor device 300 (as shown in FIG. 7E). In an embodiment, the doping concentration of the third doped regions 224 and the doping concentration of the fourth doped regions 226 can be greater than the doping concentration of the second well region 222.

Moreover, the second guard ring 220e has first mask layers 108 respectively disposed on the substrate 100 between the third doped regions 224 and the fourth doped regions 226. As shown in FIG. 7C and FIG. 7D, the first mask layers 108 include a dielectric layer 108a and a conductive layer 108b located on the dielectric layer 108a. In an embodiment, the dielectric layer 108a can be a silicon oxide layer, and the conductive layer 108b can include polysilicon or metal silicide. As shown in FIG. 6, in the present embodiment, a length L of the first mask layers 108 can be adjusted to change the gain value (i.e., β value) of bipolar junction transistor (BJT) of the semiconductor structure 10e for improving the ESD performance of the semiconductor structure 10e of the present embodiment. In an embodiment, the length L can be between 0.2 μm and 5 μm.

In the third guard ring 230e, the fifth doped regions 234 and the sub-sixth doped regions 236a and 236b are all located in the third well region 232. As shown in FIG. 7A and FIG. 7B, the fifth doped regions 234 and the sub-sixth doped regions 236a and 236b are all electrically connected to the ground terminal GND. In an embodiment, the doping concentration of the fifth doped regions 234 and the doping concentration of the sub-sixth doped regions 236a and 236b can be greater than the doping concentration of the third well region 232.

Moreover, the semiconductor structure 10e of the fifth embodiment further includes a seventh doped region 242 located in the second well region 222. In an embodiment, the seventh doped region 242 can be, for instance, electrically floating, and a distance 244 is between the seventh doped region 242 and the border between the first well region 212 (or the first guard ring 210e) and the second well region 222 (or the second guard ring 220e). In the present embodiment, the trigger voltage of an electrostatic discharge protection device 200e can be changed by adjusting the distance 244, such that the trigger voltage of the electrostatic discharge protection device 200e is less than the trigger voltage of the semiconductor device 300, thereby protecting the semiconductor device 300 and improving the performance of ESD protection. As a result, when occurring an electrostatic discharge, the static signal from the bonding pad 400 is conducted to the ground terminal GND via the electrostatic discharge protection device 200e to prevent electrostatic discharge damage to the semiconductor device 300. In an embodiment, the distance 244 can be between 0 μm and 25 μm. In another embodiment, the seventh doped region 242 may be disposed at the border between the first well region 212 and the second well region 222.

Moreover, as shown in FIG. 7A and FIG. 7B, the semiconductor structure 10e of the present embodiment further includes isolation structures 102, 104, and 106 to electrically isolate each device. The isolation structure 102 is located between the second guard ring 220e and the third guard ring 230e. The isolation structure 104 is located between a third doped region 224e (or a fourth doped regions 226e) and the seventh doped region 242. The isolation structure 106 is located between the second guard ring 220e and the first guard ring 210e. Specifically, the isolation structure 106 is located between the seventh doped region 242 and a first doped region 214e (or a second doped region 216e). In an embodiment, the material of the isolation structures 102, 104, and 106 can be, for instance, doped or undoped silicon oxide, low stress silicon nitride, silicon oxynitride, or a combination thereof, and the forming method thereof can be, for instance, local oxidation of silicon (LOCOS) or shallow-trench isolation (STI).

The semiconductor device 300 of the present embodiment includes a gate structure G and a source S and a drain D located at two sides of the gate structure G. Although the semiconductor device 300 shown in FIG. 7E has two gate structures G disposed as mirror images with the drain D as the center, the invention is not limited thereto. In other embodiments, the semiconductor device 300 can be a semiconductor device having various configurations, such as ED MOSFET, LD MOSFET, LDD MOSFET, DDD MOSFET, or a combination thereof.

It should be mentioned that, in the present embodiment, by alternately disposing a plurality of doped regions having the N conductivity type and a plurality of doped regions having the P conductivity type to form more p/n junctions and generate more BJT, the second breakdown current (It2) of the semiconductor structure of the present embodiment is increased. The second breakdown current represents the maximum current value the semiconductor structure can withstand, and after this point, the semiconductor structure is permanently damaged and has a relatively large leakage current, and the characteristics of the original devices cannot be restored. Therefore, increasing the second breakdown current of the semiconductor structure of the present embodiment increases the performance of ESD protection of the semiconductor structure of the present embodiment.

Figure 13A:
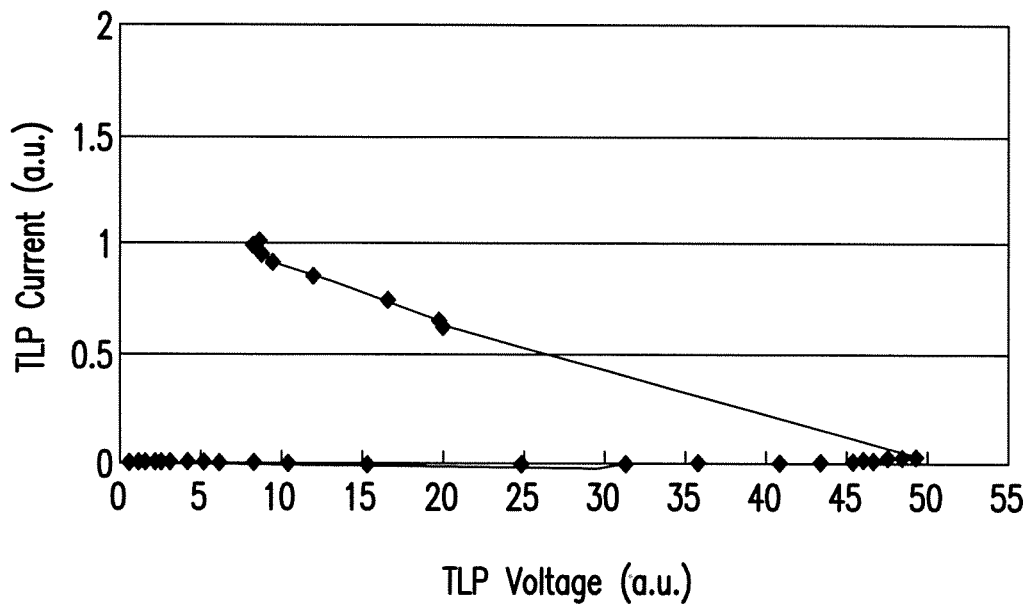
FIG. 13A is a voltage-current diagram of the ESD test results of a known semiconductor structure.
Figure 13B:
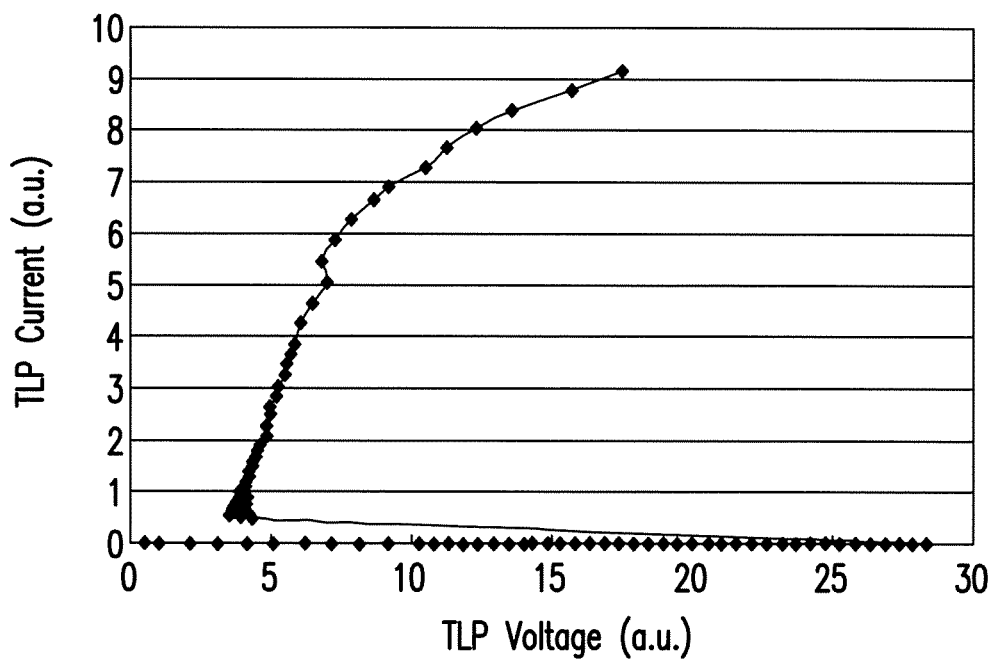
FIG. 13B is a voltage-current diagram of the ESD test results of the semiconductor structure of the second embodiment of the invention.

FIG. 13A is a voltage-current diagram of the ESD test results of a known semiconductor structure. FIG. 13B is a voltage-current diagram of the ESD test results of the semiconductor structure of the second embodiment of the invention.

The test is performed via transmission line pulse (TLP). Referring to both FIG. 13A and FIG. 13B, according to the test results, when a known semiconductor structure and the semiconductor structure 10b of the second embodiment have the same breakdown voltage (e.g. BV=38 V), the trigger voltage of the known semiconductor structure is about 50 V, and the trigger voltage of the semiconductor structure 10b of the second embodiment is about 28 V. The trigger voltage (28 V) of the semiconductor structure 10b of the second embodiment is far less than the breakdown voltage (38 V) of the known semiconductor structure. Moreover, the TLP current (i.e., second breakdown current) of the semiconductor structure 10b of the second embodiment is about 9.1 times that of the known semiconductor structure. Therefore, the semiconductor structure 10b of the present embodiment has better ESD protection performance.

FIG. 8 to FIG. 12 are respectively top views of semiconductor structures shown according to the sixth to tenth embodiments of the invention.

Figure 8:
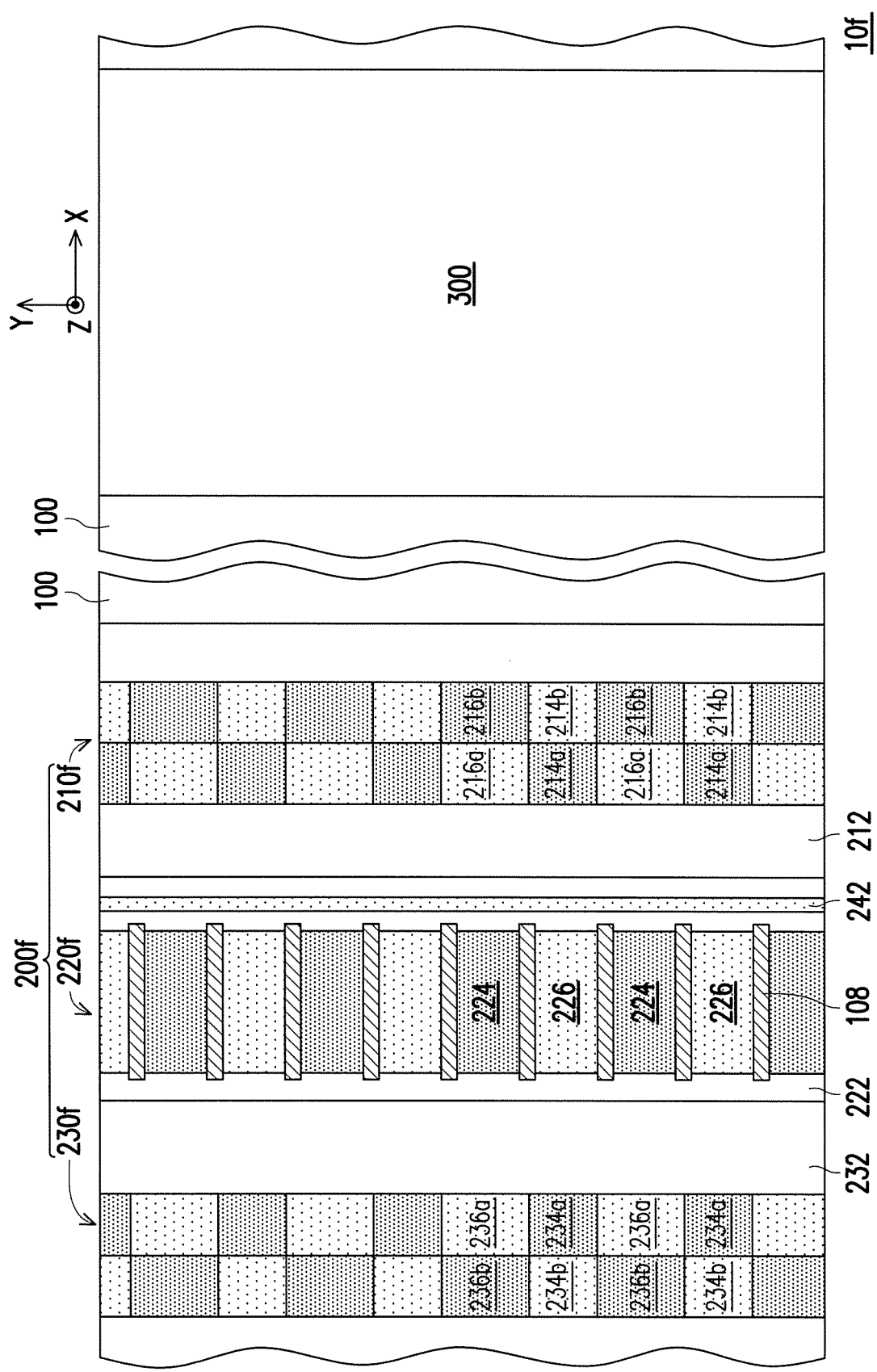
FIG. 8 to FIG. 12 are respectively top views of semiconductor structures shown according to the sixth to tenth embodiments of the invention.

Referring to FIG. 8, basically, a semiconductor structure 10f of the sixth embodiment is similar to the semiconductor structure 10c of the third embodiment. The difference between the two is: a third guard ring 230f of the sixth embodiment includes two sub-fifth doped regions 234a and 234b and two sub-sixth doped regions 236a and 236b. The two sub-fifth doped regions 234a and 234b have different conductivity types, and the two sub-sixth doped regions 236a and 236b have different conductivity types. In other words, the sub-second doped region 236a adjacent to the third doped regions 224 has the N conductivity type, and the sub-second doped region 236b away from the third doped regions 224 has the P conductivity type. The sub-fifth doped region 234a adjacent to the fourth doped regions 226 has the P conductivity type, and the sub-fifth doped region 234b away from the fourth doped regions 226 has the N conductivity type.

Figure 9:
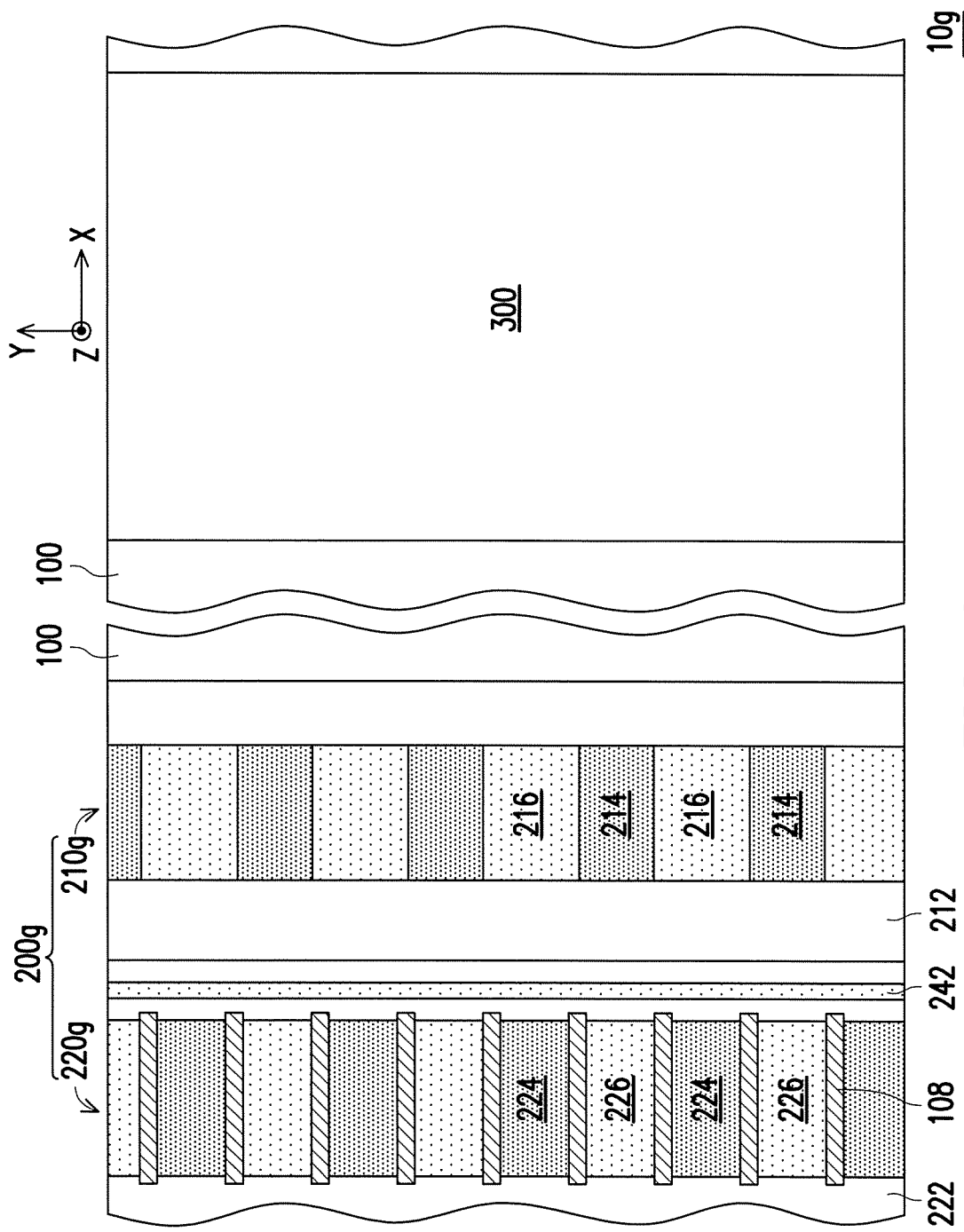

Referring to FIG. 9, basically, a semiconductor structure 10g of the seventh embodiment is similar to the semiconductor structure 10a of the first embodiment. The difference between the two is: the semiconductor structure 10g of the seventh embodiment does not include the third guard ring. In other words, the semiconductor structure 10g of the seventh embodiment can be a single P-type guard ring structure.

Figure 10:
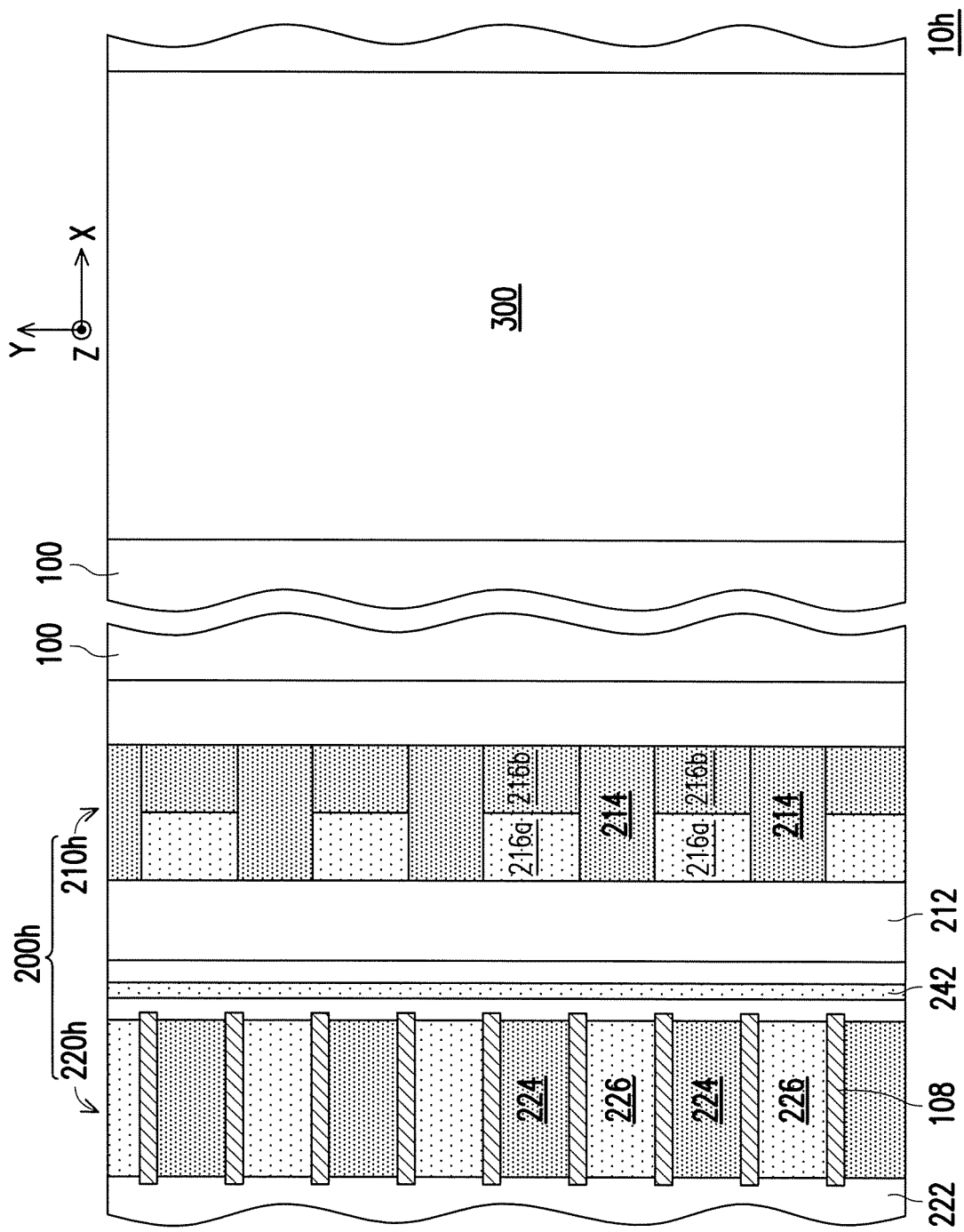

Referring to FIG. 10, basically, a semiconductor structure 10h of the eighth embodiment is similar to the semiconductor structure 10b of the second embodiment. The difference between the two is: there is no the third guard ring in the semiconductor structure 10h of the eighth embodiment.

Figure 11:
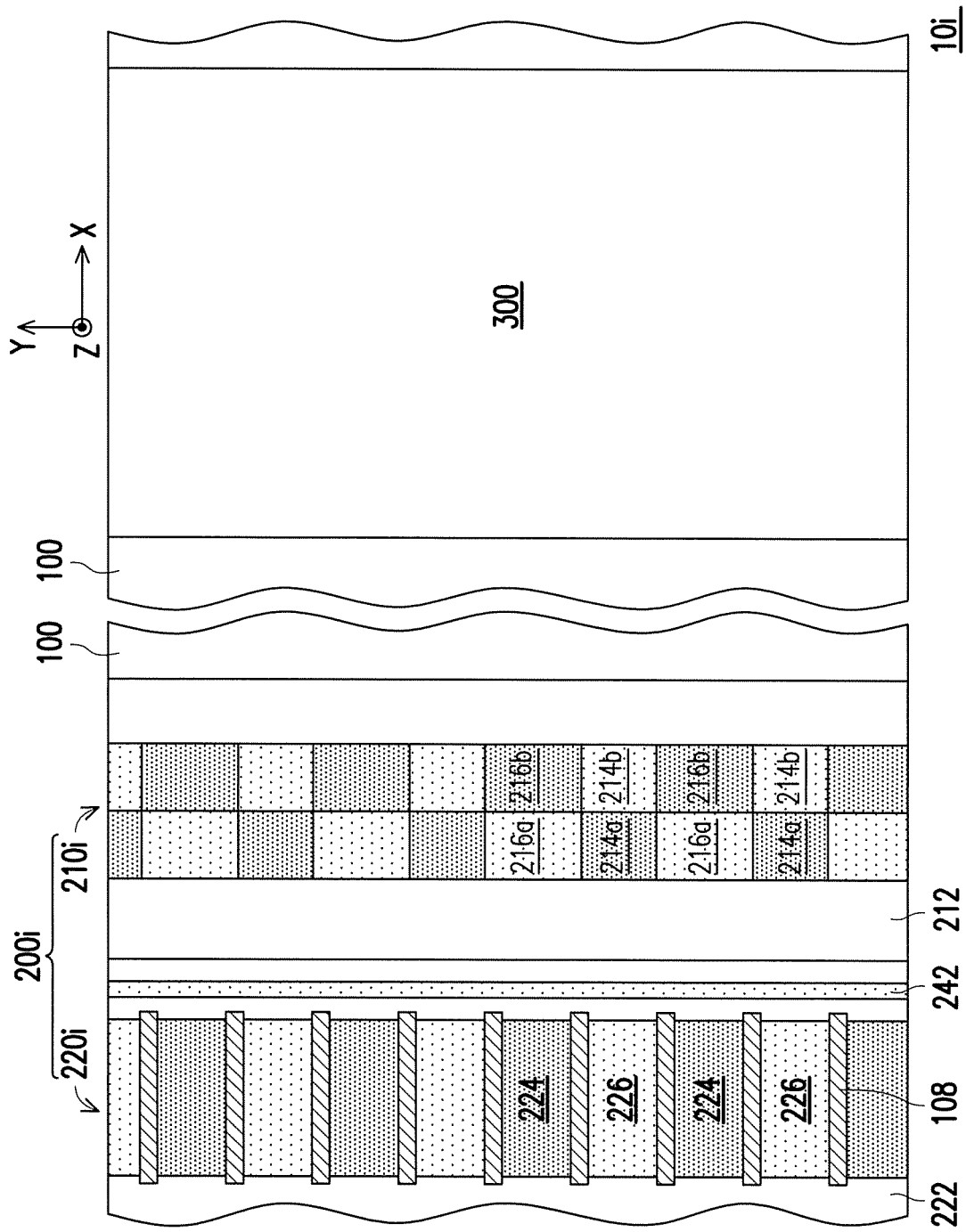

Referring to FIG. 11, basically, a semiconductor structure 10i of the ninth embodiment is similar to the semiconductor structure 10c of the third embodiment. The difference between the two is: there is no the third guard ring in the semiconductor structure 10i of the ninth embodiment.

Figure 12:
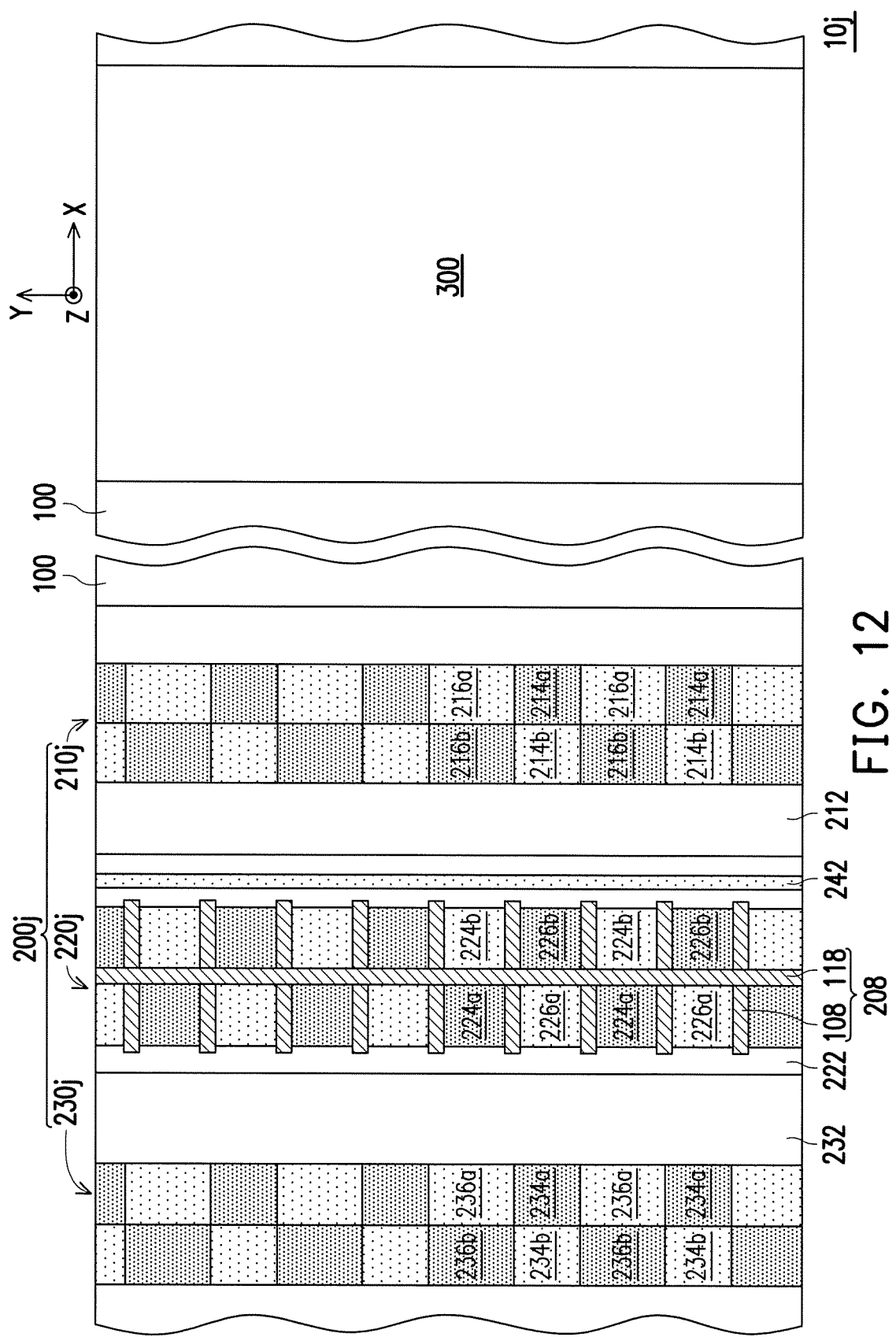

Referring to FIG. 12, basically, a semiconductor structure 10j of the tenth embodiment is similar to the semiconductor structure 10f of the sixth embodiment. The difference between the two is: a second guard ring 220j of the tenth embodiment includes two sub-third doped regions 224a and 224b and two sub-fourth doped regions 226a and 226b. The two sub-third doped regions 224a and 224b have different conductivity types, and the two sub-fourth doped regions 226a and 226b have different conductivity types. As shown in FIG. 12, the sub-third doped region 224b adjacent to the first guard ring 210j has the N conductivity type, and the sub-third doped region 224a away from the first guard ring 210j has the P conductivity type. The sub-fourth doped region 226b adjacent to the first guard ring 210j has the P conductivity type, and the sub-fourth doped region 226a away from the first guard ring 210j has the N conductivity type. The first guard ring 210j corresponds to the second guard ring 220j such that the sub-second doped region 216b adjacent to the second guard ring 220j has the P conductivity type, and the sub-first doped region 214b adjacent to the second guard ring 220j has the N conductivity type. Under such configuration, the p/n junction of the parasitic transistor formed by the sub-fifth doped regions 234b and 234a, the sub-fourth doped regions 226a and 226b, and the sub-firth doped regions 214b and 214a is increased, such that the second breakdown current of the semiconductor structure 10j is increased and the performance of electrostatic discharge protection of the semiconductor structure 10j of the present embodiment is increased as a result.

Moreover, the semiconductor structure 10j of the present embodiment further includes second mask layers 118 disposed on the substrate 100 between the two sub-third doped regions 224a and 224b and between the two sub-fourth doped regions 226a and 226b. The material and structure of the second mask layers 118 are similar to those of the first mask layers 108 and are therefore not repeated herein. As shown in FIG. 12, a mask structure 208 formed by the first mask layers 108 and the second mask layers 118 can be, for instance, fishbone structures to isolate the sub-third doped regions 224a and 224b and the sub-fourth doped regions 226a and 226b. By using the mask structure 208 as a doping mask, the sub-third doped regions 224a and 224b and the sub-fourth doped regions 226a and 226b can be more precisely aligned and formed on a predetermined location, such that the ESD performance of the semiconductor structure 10j of the present embodiment is increased.

Based on the above, in the invention, the electrostatic discharge protection device formed by the first guard ring, the second guard ring, and the third guard ring connected in parallel to one another is coupled between the bonding pad and the ground terminal, and the semiconductor device is coupled to the second guard ring. When occurring a static signal in the bonding pad, the static signal can be conducted to the ground terminal via the first guard ring, the second guard ring, and the third guard ring to prevent damage to the semiconductor device (i.e., internal circuit). Therefore, the semiconductor structure of the invention can improve the performance of electrostatic discharge protection without increasing chip area. Moreover, in the invention, the N conductivity type doped regions and the P conductivity type doped regions are arranged alternately to form more p/n junctions for increasing the second breakdown current of the semiconductor structure of the invention.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a first guard ring located in a substrate, wherein the first guard ring comprises a plurality of first doped regions and a plurality of second doped regions arranged alternately, and the first doped regions and the second doped regions have different conductivity types;
   a second guard ring located adjacent to the first guard ring, the second guard ring comprising:
      a plurality of third doped regions and a plurality of fourth doped regions arranged alternately, wherein each of the third doped regions corresponds to each of the second doped regions, each of the fourth doped regions corresponds to each of the first doped regions, the third doped regions and the first doped regions have the same conductivity type and are disposed in a staggered manner, and the third doped regions and the fourth doped regions have different conductivity types; and
      a plurality of mask layers respectively disposed on the substrate between the third doped regions and the fourth doped regions; and
   a seventh doped region having the N conductivity type located between the first guard ring and the second guard ring, wherein the seventh doped region is electrically floating.

2. The semiconductor structure of claim 1, wherein the first guard ring further comprises a first well region having a P conductivity type, and the first doped regions having the P conductivity type and the second doped regions having an N conductivity type are located in the first well region.

3. The semiconductor structure of claim 2, wherein the second guard ring further comprises a second well region having the N conductivity type, and the third doped regions having the P conductivity type and the fourth doped regions having the N conductivity type are located in the second well region.

4. The semiconductor structure of claim 2, further comprising a third guard ring located adjacent to the second guard ring such that the second guard ring is located between the third guard ring and the first guard ring.

5. The semiconductor structure of claim 4, wherein the third guard ring comprises:
   a third well region having the P conductivity type located in the substrate; and
   a fifth doped region having the P conductivity type located in the third well region.

6. The semiconductor structure of claim 1, wherein the fourth doped regions and the second doped regions have the same conductivity type and are disposed in a staggered manner.

* * * * *